United States Patent [19]

Moore et al.

[11] Patent Number: 5,064,638

[45] Date of Patent: Nov. 12, 1991

[54] SIMULTANEOUS MULTINUCLEAR MAGNETIC RESONANCE IMAGING AND SPECTROSCOPY

[75] Inventors: Gregory J. Moore, Cambridge; Mirko I. Hrovat, Brockton; R. Gilberto Gonzalez, Boston, all of Mass.

[73] Assignee: Brigham & Women's Hospital, Boston, Mass.

[21] Appl. No.: 392,853

[22] Filed: Aug. 11, 1989

[51] Int. Cl.$^5$ .................. G01N 31/00; G01N 24/00; G01V 3/00
[52] U.S. Cl. ........................ 424/9; 324/307; 324/310; 324/311; 324/314; 436/173
[58] Field of Search ............ 424/9; 324/307, 314, 324/310, 311; 436/173; 128/653, 654

[56] References Cited

U.S. PATENT DOCUMENTS

| Re. 32,689 | 6/1988 | Damadian | 128/653 |
|---|---|---|---|
| 4,443,761 | 5/1984 | Levitt | 324/311 |
| 4,506,223 | 3/1985 | Bottomley et al. | 324/309 |
| 4,549,139 | 10/1985 | MacFall et al. | 324/309 |
| 4,581,582 | 4/1986 | Redington | 324/309 |
| 4,585,992 | 4/1986 | Maudsley et al. | 324/309 |
| 4,628,262 | 12/1986 | Maudsley | 324/309 |
| 4,651,097 | 3/1987 | Iwaoka et al. | 324/309 |
| 4,654,593 | 3/1987 | Ackerman | 324/307 |
| 4,714,885 | 12/1987 | Paltiel et al. | 324/312 |
| 4,832,037 | 5/1989 | Granot | 128/653 |

OTHER PUBLICATIONS

I. L. Pykett et al., "Nuclear Magnetic Residence: In Vivo Proton Chemical Shift Imaging", *Radiology*, 1983, vol. 149, No. 1, pp. 197–201.
Paul A. Bottomley, "NMR In Medicine", *Computerized Radiology*, 1984, vol. 8, No. 1, pp. 57–77.
Thomas J. Brady et al., "Nuclear Magnetic Resonance (NMR) In Clinical Diagnosis", *Advanced Internal Medicine*, 1986, pp. 419–446.
I. J. Cox et al., "Four-Dimension Chemical Shift MR Imaging of Phosphorous Metabolites of Normal and Diseased Human Liver", *Journal of Computer Assisted Tomography*, 1988, vol. 12, No. 3, pp. 369–376.
Robert E. Lenkinski et al., "Intergrated MR Imaging and Spectroscopy With Chemical Shift Imaging of P-31 at 1.5 T: Initial Clinical Experience", *Radiology*, 1988, vol. 169, pp. 201–206.
James S. Tropp et al., "Characterization of MR Spectroscopic Imaging of the Human Head and Limb at 2.0 T", *Radiology*, 1988, vol. 169, No. 1, pp. 207–212.
Tropp, James et al., A Dual Toned Probe & Multiband Receiver Front End for X Nucleus Spectroscopy with Proton Scout Imaging in Vivo, Magnetic Resonance Medicine, 11:405–412 (1989).

*Primary Examiner*—Glennon H. Hollrah
*Assistant Examiner*—Gary E. Hollinden
*Attorney, Agent, or Firm*—Sterne, Kessler, Goldstein & Fox

[57] ABSTRACT

A method of simultaneous multinuclear magnetic resonance imaging and spatially localized NMR spectroscopy is disclosed. Clinical implementation of the disclosed method allows routine in vivo NMR spectroscopy studies without significantly increasing the time of conventional MR imaging studies. A unique sequence of rf excitation and magnetic gradient pulses is used which allows chemical shift imaging data to be acquired simultaneously with conventional imaging data. A deconvolution method extracts the chemical shift information for analysis and display.

15 Claims, 6 Drawing Sheets

SIMULTANEOUS MULTINUCLEAR MAGNETIC RESONANCE IMAGING AND SPECTROSCOPY

BACKGROUND OF THE INVENTION

1. Field of the Invention

The invention relates to the acquisition of NMR data from which both image and spectral data may be obtained from two or more nuclei simultaneously.

2. Description of Prior Art

Nuclear magnetic resonance (NMR) techniques have been used for over 30 years to acquire spectroscopic data. More recently NMR techniques have been developed which produce spatial images of an object (standard imaging). Even more recently techniques have been developed which provide both chemical shift spectroscopic and spatial information for a given nucleus (chemical shift imaging).

The most common technique for obtaining standard images is using the spin-echo or spin warp pulse sequence shown in FIG. 1. In this sequence, radio frequency (rf) excitation pulses of 90 and 180 degrees are used to excite the nuclei and generate an echo. The magnetic field gradients on during the rf pulses (Gss) perform the slice selection part of the experiment. The term gradient as used here means magnetic field gradient. The phase encoding gradient (Gpe) pulses provide for spatial encoding in one dimension and the readout gradient (Gro) pulses provide for spatial encoding in the other dimension. Note that the Gro is on during acquisition of the echo. Each of the echoes produced by repetition of this pulse sequence are acquired, stored and processed using a two dimensional Fourier Transform (2DFT). This technique will produce spatial images of an object.

The most commonly used technique for obtaining chemical shift images is shown by the pulse sequence in FIG. 2. In this experiment a 90 degree rf excitation pulse 208 is applied in the presence of Gss 202 for slice selection. The result of this excitation is a free induction decay 210 (FID). The phase encode and readout gradients may be thought of as phase encoding pulses in the x and y directions respectively. The stepped Gpex and Gpey pulses (i.e., the phase encode pulses in the x and y directions) provide for spatial encoding of the image. A three-dimensional Fourier Transform (3DFT) on the FIDs acquired by repetition of this pulse sequence produces a spatial image of the object and chemical shift spectra from each volume element (voxel) of the image. Note that the chemical shift spectroscopic information is preserved using this pulse sequence since no gradients are present during acquisition of the FID. It is also important to note that flip angles other than 90° and 180° can be used with the method of this invention.

It would be advantageous to acquire both a standard image (typically of H-1 which provides high resolution anatomical information) and a chemical shift image (typically of P-31 which provides an in vivo metabolite map) on patients submitted for magnetic resonance imaging exams. Lenkinski et al. and Tropp et al. both describe this type of exam with a sequential acquisition scheme shown in FIG. 3, Method 3A. They first acquire a standard image and then acquire a chemical shift image. However this method is rarely used in clinical situations because of the excessive time required to perform the two sequential studies. Imaging time, sometimes referred to as magnet time is very expensive. As a result of the high cost of magnet time, health professionals and/or their patients may forego certain diagnostic tests. It would be most advantageous if one could perform the two studies simultaneously in order to make the most efficient and cost effective use of imaging time. The reduced cost resulting from the procedure of this invention would allow health professionals to obtain more useful diagnostic information.

SUMMARY OF THE INVENTION

The invention provides a rf and gradient pulse sequence for providing standard images from one nucleus and chemical shift images from another nucleus simultaneously. For example, in a typical experiment H-1 echoes would be acquired, thereby producing a standard image. P-31 FIDs would be acquired, thereby producing a chemical shift image. However, acquisition of the NMR data would occur simultaneously (see FIG. 3), a much more efficient scheme than a sequential or an interleaved acquisition technique.

In order to accomplish this one cannot simply combine the standard imaging and chemical shift imaging pulse sequences simultaneously because the various pulses and gradients of one sequence will interfere with the other sequence and corrupt both data sets. By the present invention, a unique pulse sequence was developed which is able to acquire standard images and chemical shift images from multiple nuclei simultaneously (see FIG. 4). One unique aspect of this pulse sequence is that one may preserve chemical shift information acquired in the presence of a gradient. The chemical shift information is extracted from the data set using a novel deconvolution technique which performs a "tilt" or "shearing" function.

In one embodiment, a simultaneous multinuclear imaging and spectroscopy (SMIS) pulse sequence is implemented by use of a dual spectrometer arrangement as shown in FIG. 6. A dual resonance volume coil tuned to the nuclei of interest may be used as the rf probe. Hydrogen, sodium and phosphorous nuclei are commonly of interest. The technique can be easily modified for use of other and/or more nuclei with appropriate rf probes and spectrometers. Other than the aforementioned hardware, the sequence can be implemented on a commercial MR scanner equipped with actively shielded gradient coils such as the 1.5T General Electric SIGNA.

Use of actively shielded gradient coils is not required but their use means that eddy current effects are minimized.

DETAILED DESCRIPTION OF THE PREFERRED EMBODIMENTS

In one preferred embodiment two spectrometers are used for simultaneously exciting and sampling each nuclei. A single coaxial cable between the spectrometers serves as a communication link in order to synchronize the two systems.

Figure 1:
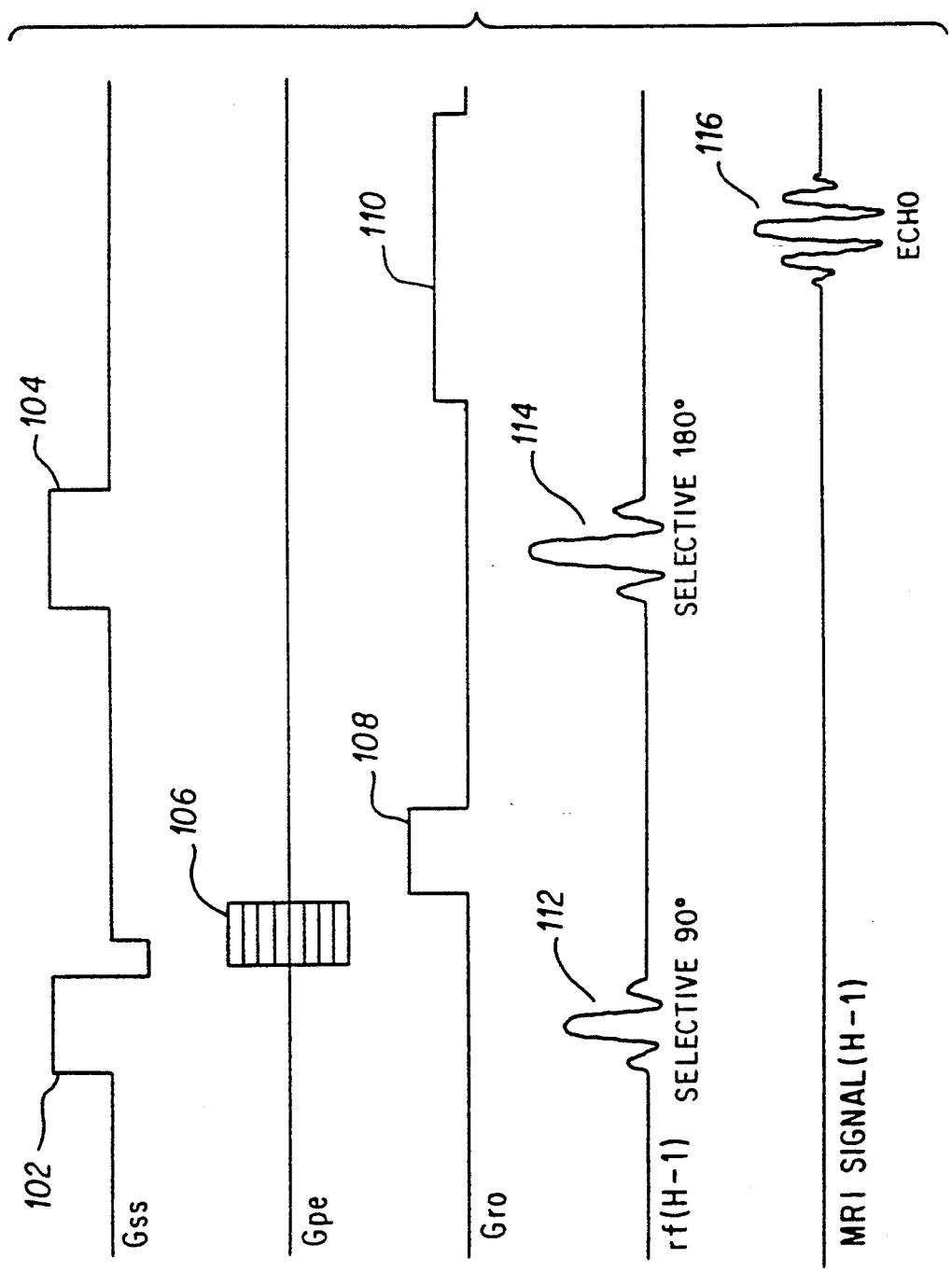
FIG. 1: A conventional spin-echo rf and gradient pulse sequence used to obtain standard images.
Figure 2:
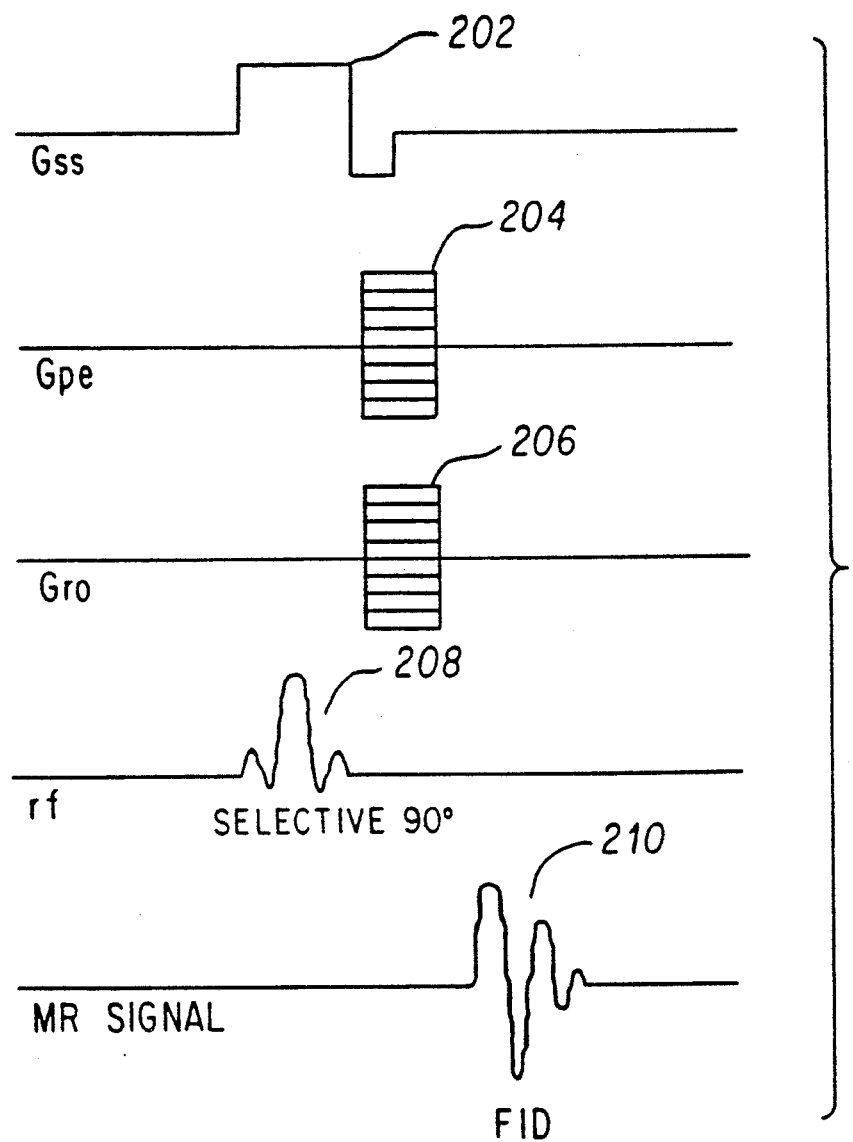
FIG. 2: A conventional rf and gradient pulse sequence used for obtaining chemical shift images.
Figure 3A:
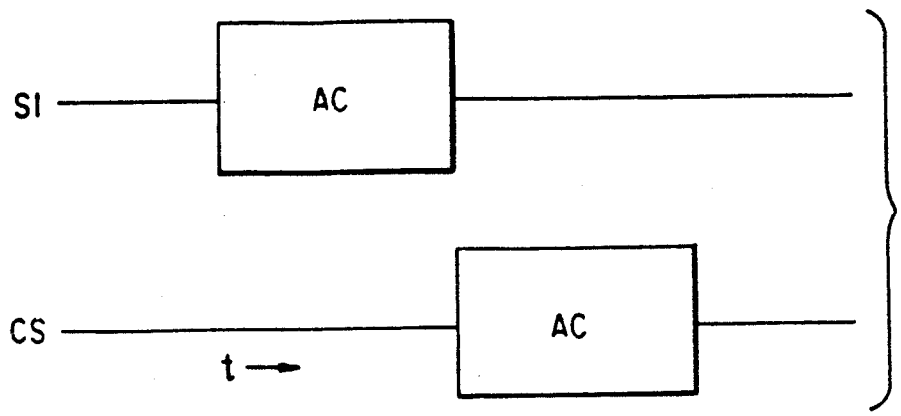
FIG. 3: Illustration of sequential (a), interleaved (b) and simultaneous (c) data acquisition schemes, the simultaneous scheme is the subject of the invention, whereas the sequential and interleaved acquisition schemes have been described previously.
Figure 3B:
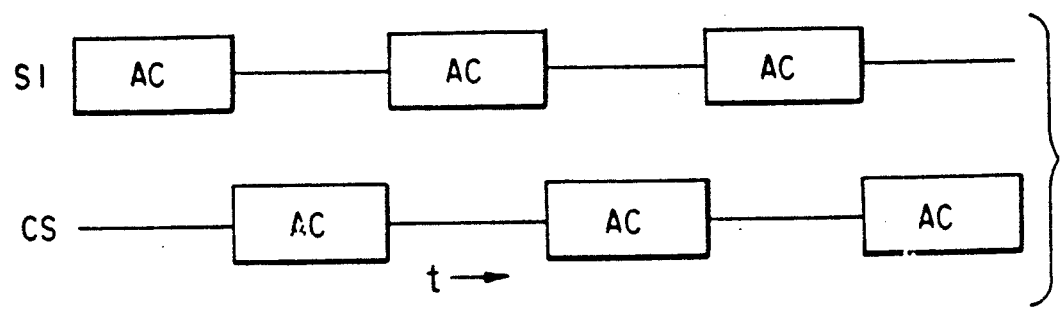
Figure 3C:
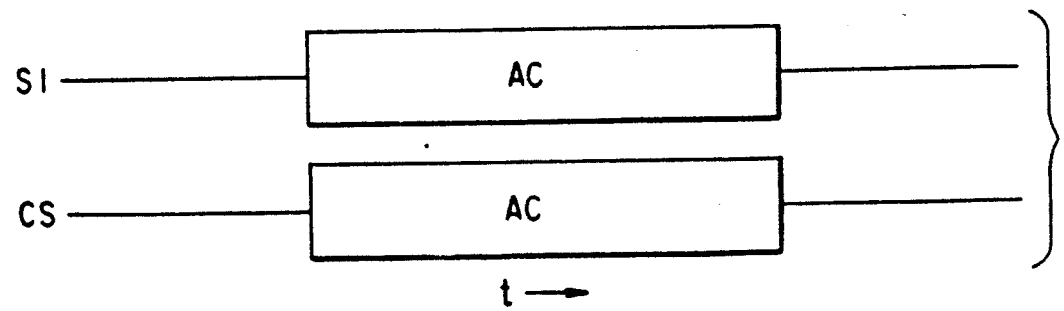
Figure 4:
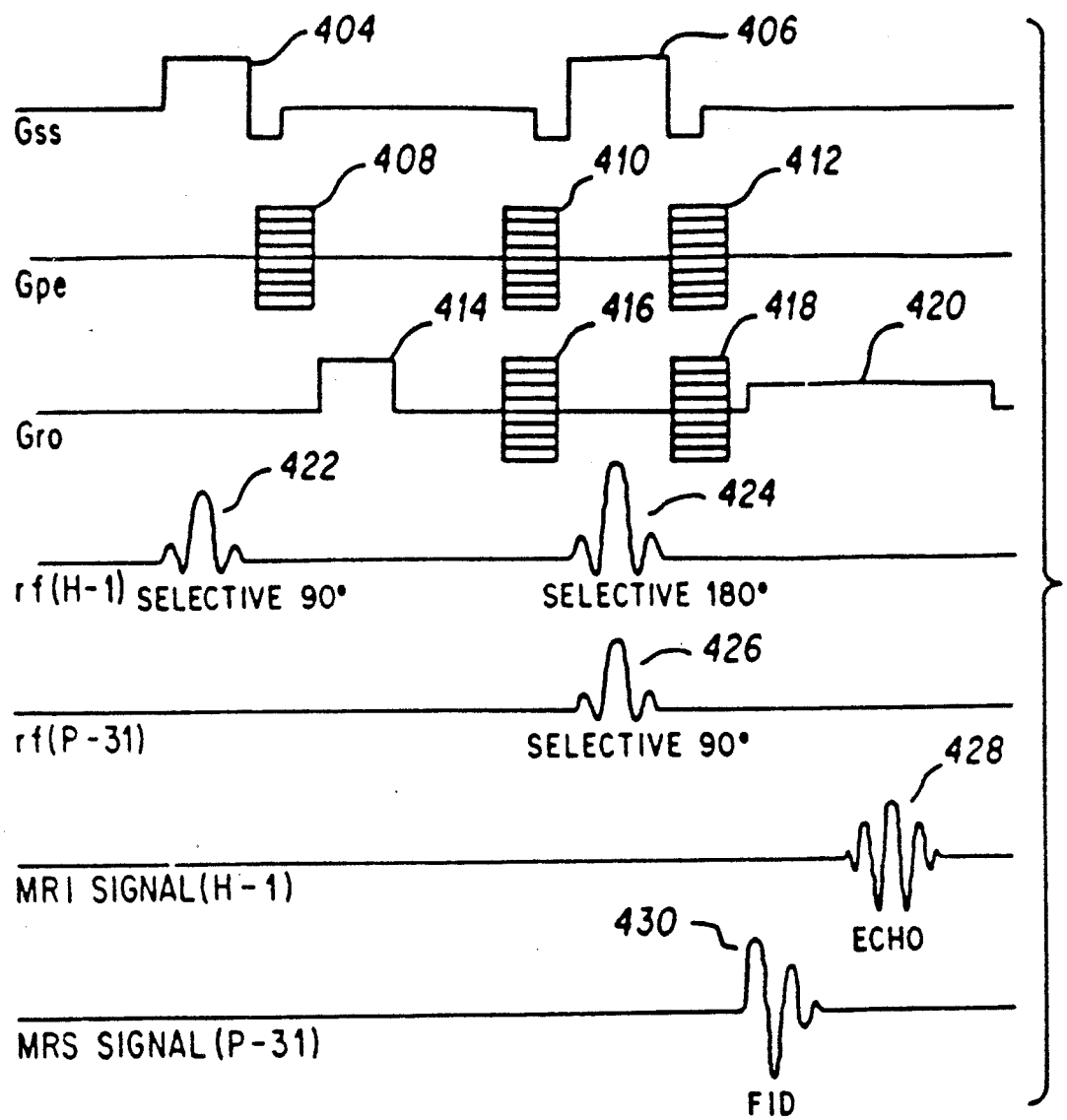
FIG. 4: The rf and gradient pulse sequence for performing the SMIS technique described in the invention.
Figure 5A:
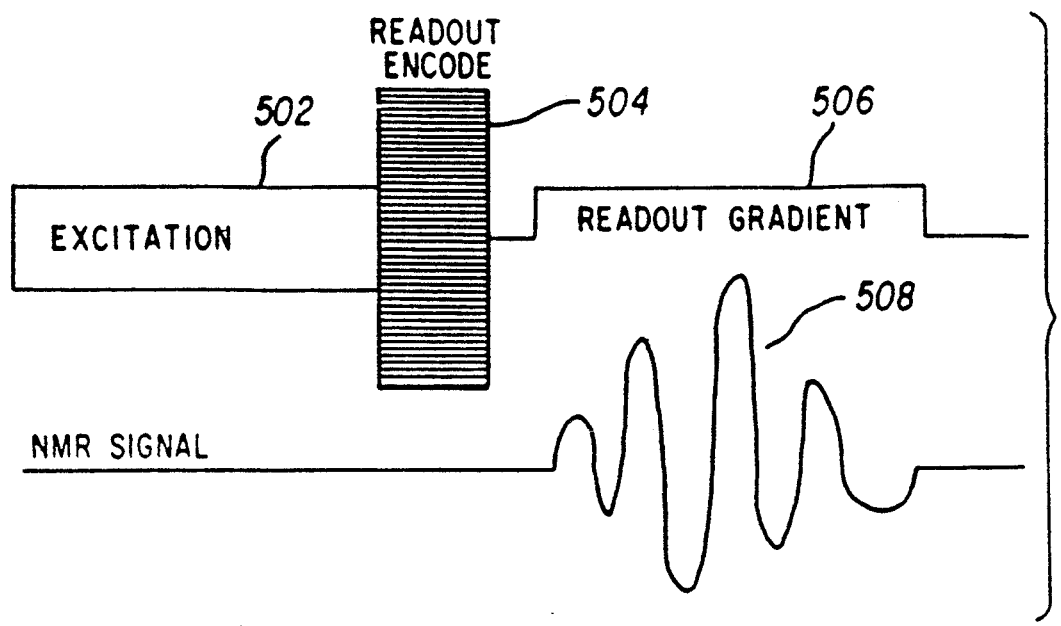
FIG. 5: Novel deconvolution technique for extraction of chemical shift information acquired in the presence of a magnetic field gradient as shown in the SMIS sequence and described in the invention.
Figure 5B:
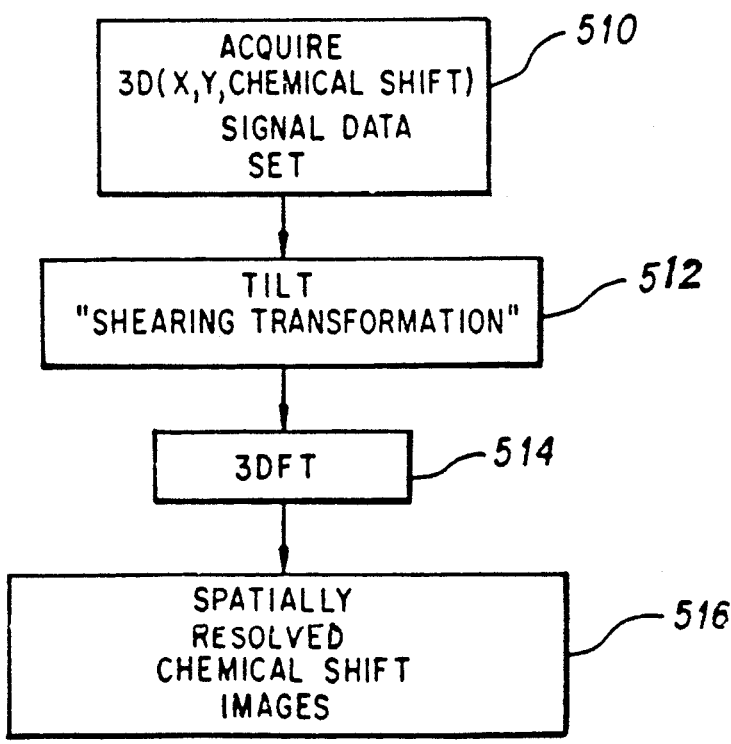
Figure 6:
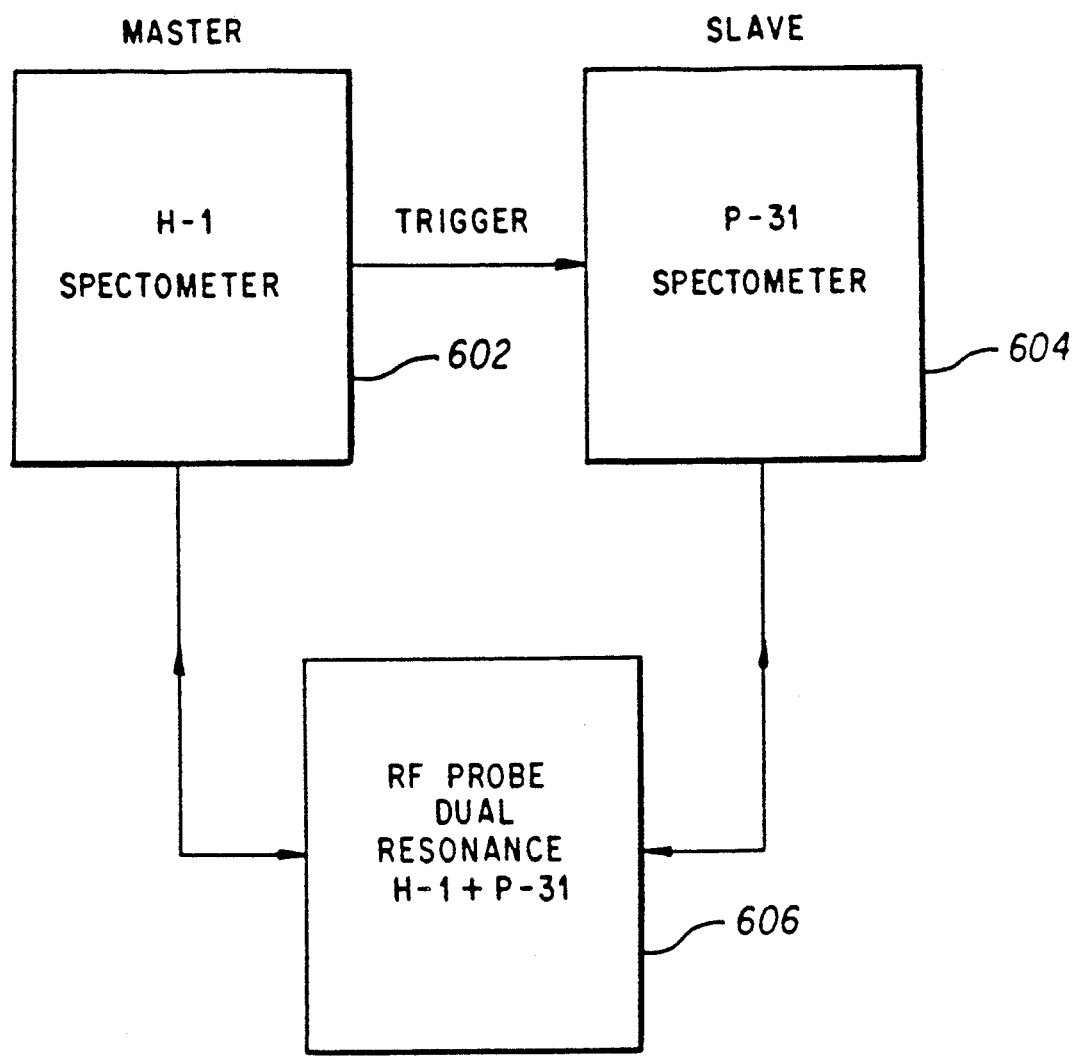
FIG. 6: Illustration of the hardware setup for performing the SMIS technique as described in the invention.

The key features of this invention can be best understood by comparing FIGS. 1 and 2 with FIG. 4. FIGS. 1 and 2 represent conventional pulse sequences for standard imaging and chemical shift imaging, respectively. FIG. 4 represents the rf and gradient pulse sequence for the SMIS technique.

In all types of NMR imaging methods a series of rf and magnetic gradient pulses are applied in order to appropriately excite and encode the information from the object being imaged. This is also true using the SMIS technique. As shown in FIG. 4, the SMIS pulse sequence begins with a selective 90 degree rf pulse 422 at the H-1 frequency applied in the presence of the slice selection gradient 404 (Gss). This first step excites H-1 spins in only the selected plane by flipping the spins 90 degrees. A gradient reversal then takes place on Gss in order to compensate for the dephasing of the in plane spins which occurred during the rf pulse.

The next step in the SMIS sequence is application of the first phase encoding gradient pulse 408 (Gpe) which serves to encode one of the spatial dimensions of the H-1 image. The gradient values are expressed in units of Gauss/cm or mTesla/meter. These encoding pulses are programmable and are stepped n times at equal values of $\Delta Gpe$ for an image of $n \times n$ pixels. For example, to make an image with a resolution of $256 \times 256$ pixels the Gpe would have 256 different values in order to properly encode the spatial information, a different value each time the pulse sequence is repeated.

The next step is a readout gradient pulse 414 used for dephasing the excited H-1 spins for later refocusing and signal acquisition.

The next step is a delay time on the order of milliseconds where all gradients and rf pulses are off. This delay is adjustable in order to allow for changes in the echo time (TE) for the purpose of contrast weighing of the H-1 images. The delay is followed by two gradient encoding pulses in the Gpe 410 and Gro 416 directions. These encoding pulses serve to cancel the effect of the next Gpe 412 and Gro 418 encodes so that the H-1 image data is not perturbed. The values for the Gpe and Gro encodes are exactly the same as their following counterparts. Since they are on either side of the H-1 180 pulse they effectively cancel one another.

The next step in the sequence is a dephasing Gss pulse 406 which also serves to cancel the effect of its counterpart on the opposite side of the H-1 180 degree pulse. Again, this pulse is necessary to prevent the H-1 image data from being perturbed. The following step in the pulse sequence begins the simultaneous part of the technique. A 180 degree H-1 rf pulse 424 is applied in the presence of the slice selection gradient 406 and at this point a slave spectrometer is triggered and a 90 degree P-31 rf pulse 426 is also applied concurrently with the other pulses. The Gss pulse 406 serves a dual purpose in this case, providing slice selection for the H-1 image slice and also for the P-31 chemical shift image slice.

The subsequent step is a gradient reversal of Gss, this time to rephase the P-31 spins which dephased during the P-31 rf pulse. This is followed by two gradient encoding pulses on Gpe 412 and Gro 418 which serve to spatially encode the P-31 chemical shift image. Note that the last three gradient pulses have not perturbed the H-1 data set because of the cancellation gradient pulses applied prior to the H-1 180 degree pulse. In addition to its spatial encoding, the Gro encode also serves to specially encode the P-31 chemical shift data for later deconvolution.

The next step is turning on the readout gradient Gro 420 which is necessary for frequency encoding the H-1 image data set. The H-1 echo 428 is collected in the presence of this gradient in order to get the final H-1 spatial dimension. Since one cannot wait to collect the P-31 FID 430 because of its short spin-spin relaxation time (T2), one must also acquire it in the presence of the readout gradient. This brings about the need for deconvolution of the chemical shift information since both spatial and chemical shift information are now coupled along one dimension.

Both the standard images and the chemical shift images will be spatially encoded properly using the SMIS sequence if the following relations for rf and magnetic field gradient pulses are used. The chemical shift information will also be properly encoded for later deconvolution if these relations are implemented properly.

1) $[FOV_{ROH}]^{-1} = \gamma_H G_{ROE} DW_H$

2) $[FOV_{PEH}]^{-1} = \gamma_H \Delta G_{PEH} t_{PEH}$

3) $[FOV_{ROP}]^{-1} = \gamma_P \Delta G_{ROP} t_{ROEP}$

4) $[FOV_{PEP}]^{-1} = \gamma_P \Delta G_{PEP} t_{PEP}$

5) $\dfrac{G_{ROH}}{SW_P} = \Delta G_{ROE} t_{ROE}$ where:
FOV = Field of View
RO = Read out   ROE = Read Out Encode
t = duration of gradient pulse   PE = phase encode
g = gradient
P = phosphorus$^{31}$   H = hydrogen$^{1}$
$\gamma$ = gyromagnetic ratio
SW = spectral width
DW =

$$\frac{1}{SW}$$

$\Delta G$ = incremental gradient amplitude

After acquisition of data using the SMIS pulse sequence, computer processing of the data is necessary. A conventional 2DFT is performed on the H-1 image data set which produces standard proton images of the object. The P-31 chemical shift image data set requires a bit more processing. The time domain P-31 chemical shift image data set properly encoded with the SMIS sequence will lie along a diagonal at 45 degrees with respect to the horizontal plane. This represents the chemical shift dimension coupled to a spatial dimension. This problem is very similar to 2D homonuclear J-spectroscopy where chemical shift and J-J spin coupling are coupled in the same dimension. We therefore use a similar solution by performing a "tilt" or "shearing" operation on the data set. The shearing method is described by Ernst et al. in "Principles of NMR in One and Two Dimensions", Oxford Univ. Press, New York, 1987. In our application, by "tilting" the time domain data set 45 degrees back to the horizontal the spatial and chemical shift coordinates are made orthogonal to each other. Now after the tilting process is completed, a 3DFT is performed on the data set yielding chemical shift images of various phosphorus metabolites such as inorganic phosphate, phosphocreatine, ATP, phosphodiesters and phosphomonoesters. In addition the pH may also be obtained by the chemical shift of the inorganic phosphate in relation to phosphocreatine. A variety of different display techniques are available with this type of three dimensional data set including P-31 metabolite maps and NMR spectra from each voxel of the image.

The SMIS sequence can be run on most commercial MRI systems equipped with shielded gradient coils which minimize eddy current effect. Many such systems manufactured by General Electric and Siemens are currently in use. Dual tuned rf probes are common in the field of NMR spectroscopy and have been in use for over 20 years. The only extra hardware requirements necessary for implementing the SMIS pulse sequence is an extra spectrometer equipped with a suitable receiver and transmitter system. Spectrometers such as this are commercially available from many manufacturers including those listed above.

One can envision many obvious modifications of the SMIS technique and its related embodiments such as changes in the durations and strengths of the rf and magnetic field gradient pulse sequence, extension of the technique to three or more nuclei for imaging and/or spectroscopy, use of spin echoes instead of FIDs, modification of the standard imaging scheme to include a two echo or 3D data acquisition, changing the 3D chemical shift data acquisition to a 4D acquisition, use of half Fourier methods to decrease acquisition time, alternative deconvolution processes, etc. These and many other modifications are straightforward extensions of the SMIS technique and its related embodiments.

What is claimed is:

1. A method for simultaneously obtaining multinuclear magnetic resonance data from at least first and second nuclear species disposed in a static magnetic field, comprising the steps of:
   (a) generating a pulse sequence comprising a series of rf excitation and magnetic field gradient waveforms;
   (b) applying said pulse sequence during an interval concurrently to said at least first and second nuclear species;
   (c) acquiring from said pulse sequence applied during said interval first NMR signals of said first nuclear species;
   (d) acquiring from said pulse sequence applied during said interval concurrently with the acquisition of said first NMR signals, second NMR signals of said second nuclear species; and
   (e) repeating steps (a)-(d), including varying at least one of said rf excitation and magnetic field gradient waveforms to acquire further multinuclear magnetic resonance data from said at least first and second nuclear species.

2. The method of claim 1, wherein applying said pulse sequence comprises the steps of:
   (a) applying a magnetic gradient slice selection pulse simultaneously with a selective rf pulse at a first frequency;
   (b) applying a magnetic gradient phase encoding pulse;
   (c) applying a magnetic gradient read out pulse;
   (d) providing a time period without magnetic or rf pulses;
   (e) applying simultaneously phase encoding and read out magnetic gradient pulses;
   (f) applying simultaneously a magnetic gradient slice selection pulse, a selective rf pulse of said first frequency and a selective rf pulse at a second frequency;
   (g) applying simultaneously phase encoding and read out magnetic gradient pulses;
   (h) waiting for a time period sufficient to receive the free induction decay information signal and the spinspin echo information signal; and
   (i) repeating steps (a) through (h) n times, where n is equal to the number of samples desired in the phase encode direction and for each repetition stepping at equal values of $\Delta G_{PE}$ the magnetic gradient phase encoding pulses.

3. The method of claim 1, wherein said first and second NMR signals are acquired using a dual resonance volume coil.

4. The method of claim 3, wherein said dual resonance volume coil is tuned to a first type of nucleus at a frequency equal to the product of the gyromagnetic ratio of said first nucleus and the static magnetic field, and tuned to a second type of nucleus at a frequency equal to the product of the gyromagnetic ratio of said second type of nucleus and the static magnetic field.

5. The method of claim 1, wherein two spectrometers are used for simultaneously exciting and sampling of each nuclei.

6. The method of claim 5, wherein said two spectrometers are synchronized by signaling over a communications link.

7. A method according to claim 1, wherein said first and second NMR signals correspond to magnetic resonance images.

8. A method according to claim 1, wherein said first and second NMR signals correspond to chemical shift images.

9. A method according to claim 1, wherein said first NMR signals correspond to magnetic resonance images and said second NMR signals correspond to chemical shift images.

10. A system for simultaneously obtaining multinuclear magnetic resonance data from at least first and second nuclear species disposed in a static magnetic field, comprising:
    means for generating a plurality of pulse sequences, wherein each pulse sequence comprises a series of rf excitation and magnetic field gradient waveforms;
    means for applying said pulse sequences during sequential time intervals concurrently to said at least first and second nuclear species;
    means for acquiring from the pulse sequence applied during a given time interval first nuclear magnetic resonance (NMR) signals of said first nuclear species;
    means for acquiring for the pulse sequence applied during a given time interval second NMR signals of said second nuclear species concurrently with the acquisition of said first NMR signals; and means for varying at least one of said rf excitation and magnetic filed gradient waveforms during or between predetermined ones of said time intervals.

11. A system according to claim 10, wherein said first and second NMR signals correspond to magnetic resonance images.

12. A system according to claim 10, wherein said first and second NMR signals correspond to chemical shift images.

13. A system according to claim 10, wherein said first NMR signals correspond to magnetic resonance images and said second NMR signals correspond to chemical shift images.

14. A system according to claim 10, wherein said means for acquiring said first and second NMR signals comprises a dual resonance volume coil.

15. The method of claim 1, wherein the following relations between rf excitation pulses and magnetic-field gradient pulses are maintained:

$$[FOV_{ROH}]^{-1} = \gamma_H G_{ROE} DW_H$$

-continued $$[FOV_{PEH}]^{-1} = \gamma_H \Delta G_{PEH} t_{PEH}$$

$$[FOV_{ROP}]^{-1} = \gamma_P \Delta G_{ROp} t_{ROE_p}$$

$$[FOV_{PEP}]^{-1} = \gamma_P \Delta G_{PEp} t_{PE_p}$$

$$\frac{G_{ROH}}{SW_p} = \Delta G_{ROE} t_{ROE}$$

where:
FOV = Field of View
RO = Read out  ROE = Read Out Encode
t = Time  PE = phase encode
G = gradient
P = phosphorous$^{31}$  H = hydrogen$^1$
$\gamma$ = gyromagnetic ratio
SW = specitral width
DW =

$$\frac{1}{SW}$$

$\Delta G$ = incremental gradient amplitude.

* * * * *